United States Patent
Lee et al.

(10) Patent No.: US 8,334,556 B2
(45) Date of Patent: Dec. 18, 2012

(54) DRAM SEMICONDUCTOR DEVICE WITH PAD ELECTRODE

(75) Inventors: Joo-Young Lee, Hwaseong-si (KR); Ki-Nam Kim, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 399 days.

(21) Appl. No.: 12/556,648

(22) Filed: Sep. 10, 2009

(65) Prior Publication Data

US 2010/0059805 A1  Mar. 11, 2010

(30) Foreign Application Priority Data

Sep. 10, 2008 (KR) .................. 10-2008-0089052

(51) Int. Cl.
 *H01L 29/78* (2006.01)
 *H01L 29/94* (2006.01)
(52) U.S. Cl. .......... 257/306; 257/E21.646; 257/E27.084
(58) Field of Classification Search .................. 257/300, 257/303, E29.201, 301, 306, E27.084, E21.646
See application file for complete search history.

(56) References Cited

U.S. PATENT DOCUMENTS

| | | | |
|---|---|---|---|
| 6,261,899 B1 * | 7/2001 | Lane et al. | 438/253 |
| 6,337,267 B1 * | 1/2002 | Yang | 438/618 |
| 6,649,510 B2 * | 11/2003 | Lee | 438/618 |
| 6,897,145 B2 * | 5/2005 | Park | 438/637 |
| 7,098,135 B2 * | 8/2006 | Chung et al. | 438/694 |
| 7,244,659 B2 | 7/2007 | Tang et al. | |
| 7,655,969 B2 * | 2/2010 | Takaishi | 257/303 |
| 7,728,373 B2 * | 6/2010 | Seo et al. | 257/306 |
| 2006/0006410 A1 * | 1/2006 | Lee et al. | 257/145 |
| 2006/0231880 A1 * | 10/2006 | Yamakawa et al. | 257/306 |
| 2006/0273388 A1 * | 12/2006 | Yamazaki | 257/330 |
| 2008/0164514 A1 * | 7/2008 | Sugioka | 257/328 |
| 2008/0203455 A1 * | 8/2008 | Jang et al. | 257/306 |
| 2009/0020809 A1 * | 1/2009 | Kitamura et al. | 257/330 |

FOREIGN PATENT DOCUMENTS

| | | |
|---|---|---|
| KR | 10-0640650 | 10/2006 |
| KR | 10-0743627 | 7/2007 |

* cited by examiner

*Primary Examiner* — Jerome Jackson, Jr.
*Assistant Examiner* — Paul Budd
(74) *Attorney, Agent, or Firm* — Stanzione & Kim, LLP

(57) ABSTRACT

A semiconductor device includes a semiconductor substrate having an active region and an isolation region. A gate structure is provided on the semiconductor device. First and second impurity regions are provided in the substrate on both sides of the gate structure. A pad electrode is provided to contact the first impurity region. Because the pad electrode is provided on the first impurity region of the semiconductor device, the contact plug does not directly contact the active region. Accordingly, failures caused by damage to the active region may be prevented.

12 Claims, 15 Drawing Sheets

DRAM SEMICONDUCTOR DEVICE WITH PAD ELECTRODE

CROSS-REFERENCE TO RELATED APPLICATIONS

This application claims priority under 35 U.S.C. §119 to Korean Patent Application No. 2008-89052, filed on Sep. 10, 2008 in the Korean Intellectual Property Office (KIPO), which is incorporated herein by reference in its entirety.

BACKGROUND

1. Field of the Invention

Example embodiments relate to a semiconductor device and a method of manufacturing the semiconductor device. More particularly, example embodiments relate to a semiconductor device having excellent data retention characteristics, a method of manufacturing the semiconductor device, a DRAM device, and a method of manufacturing the DRAM device.

2. Description of the Related Art

As a semiconductor devices become more highly integrated, the gate lengths of MOS transistors in the semiconductor device are greatly decreased. Recently, for example, a three-dimensional recess cell array transistor has been used as the MOS transistor in the semiconductor device.

Due to the size reduction of the MOS transistor, gate induced drain leakage (GIDL) and junction leakage current in the transistor are also increased. Thus, data retention characteristics of the semiconductor device are deteriorated by leakages of electric charges stored in the semiconductor device.

For example, the leakage current may occur due to trap sites generated by damage or stress generated during manufacturing the semiconductor device.

Accordingly, to prevent the trap sites from being generated, it may be required to optimize processes of manufacturing the semiconductor device.

Especially, due to the leakage current in a DRAM device, data retention time may shorten greatly and a refresh cycle may lengthen. Therefore, to manufacture a DRAM device having excellent characteristics, a new structure and method capable of preventing damages are required.

SUMMARY

Example embodiments provide a semiconductor device capable of preventing leakage current.

Example embodiments provide a method of manufacturing the semiconductor device.

Example embodiments provide a DRAM device having excellent data retention characteristics.

Example embodiments provide a method of manufacturing the semiconductor device.

Additional aspects and utilities of the present general inventive concept will be set forth in part in the description which follows and, in part, will be obvious from the description, or may be learned by practice of the general inventive concept.

Features and utilities of the present general inventive concept may be realized by a semiconductor device including a semiconductor substrate having an active region and an isolation region. A gate structure is provided on the semiconductor device. First and second impurity regions are provided under a surface of the substrate in both sides of the gate structure. A pad electrode is provided to make contact with the first impurity region.

The pad electrode may have a shape extending from the active region including the first impurity region to the isolation region adjacent to the active region.

The semiconductor device may further include a first contact plug making contact with an upper surface of the pad electrode and a second contact plug making contact with the second impurity region in the substrate.

The first contact plug may contact the pad electrode at a location above the isolation region of the semiconductor substrate.

The pad electrode may include the same semiconductor material as the semiconductor substrate.

Features and utilities of the present general inventive concept may also be realized by a method of manufacturing a semiconductor device in which an isolation process is performed on a semiconductor substrate to form an active region and an isolation region in the semiconductor substrate. A gate structure is formed on the semiconductor substrate. Impurities are doped into the semiconductor substrate in both sides of the gate structure to form a first impurity region and a second impurity region. A pad electrode contacting the first impurity region is formed on the semiconductor substrate.

Forming the pad electrode may include forming a mask pattern that selectively exposes the active region including the first impurity region and the isolation region adjacent to the active region and performing a selective epitaxy growth process using the exposed semiconductor substrate as a seed to form the pad electrode.

The method may further include forming a first insulation interlayer to cover the gate structure, etching the first insulation interlayer to form a first contact hole exposing an upper surface of the pad electrode, and filling the first contact hole with a conductive material to form a first contact plug.

Etching the first insulation layer may include exposing only a portion of the pad electrode located above the isolation region of the semiconductor substrate.

Features and utilities of the present general inventive concept may also be realized by a DRAM device includes a semiconductor substrate including an active region and an isolation region. A gate structure is provided on the semiconductor device. First and second impurity regions are provided under a surface of the substrate in both sides of the gate structure. A pad electrode is provided to make contact with the semiconductor substrate including the first impurity region. A bit line structure is electrically connected to the second impurity region. A contact plug makes contact with the pad electrode. A capacitor is electrically connected to the contact plug.

The semiconductor device may include a plurality of semiconductor devices, the at least one gate may include a plurality of gates arranged in parallel in a first direction on the substrate, and each active region of the plurality of semiconductor devices may be arranged so that a lengthwise axis of the active region runs in a second direction that is not perpendicular to the first direction.

The pad electrode may include the same semiconductor material as the semiconductor substrate.

The pad electrode may have a shape extending from the active region including the first impurity region to the isolation region adjacent to the active region.

The contact plug may make contact with a surface of the pad electrode positioning on the isolation region.

The bit line structure may include a bit line contact making contact with an upper surface of the second impurity region, and a bit line making contact with an upper surface of the bit line contact.

The DRAM device may further include a spacer provided on both sidewalls of the gate structure.

The DRAM device may further include a second contact plug provided between the contact plug and the capacitor.

A recess portion may be formed in the active region of the semiconductor substrate, and the gate structure may fill the recess portion and protrude from the surface of the semiconductor substrate.

In a method of manufacturing a DRAM device, an isolation process may be performed on a semiconductor substrate to form an active region and an isolation region in the semiconductor substrate. A gate structure is formed on the semiconductor substrate. Impurities are doped into the semiconductor substrate in both sides of the gate structure to form a first impurity region and a second impurity region. A contact plug is formed to make contact with the pad electrode. A pad electrode is formed to selectively make contact with the first impurity region. A bit line structure is formed to be electrically connected to the second impurity region. A capacitor is formed to be electrically connected to the contact plug.

Forming the pad electrode may include forming a mask pattern that selectively exposes the active region including the first impurity region and the isolation region adjacent to the active region and performing a selective epitaxy growth process using the exposed semiconductor substrate as a seed to form the pad electrode.

The pad electrode may be overgrown laterally from the semiconductor substrate such that the pad electrode extends to the isolation region adjacent to the active region in the selective epitaxy growth process.

The contact plug may make contact with a surface of the pad electrode that faces with the isolation region.

The method may further include forming a spacer on both sidewalls of the gate structure.

The method may further include forming a recess portion in the active region of the semiconductor substrate, and the gate structure may be formed in the recess portion.

The method may further include oxidizing a surface of the recess portion to form a gate insulation layer before forming the gate structure in the recess.

Features and utilities of the present general inventive concept may also be realized by a semiconductor device including a substrate having an active region and an isolation region and at least one gate structure located in the active region of the substrate, a portion of the gate structure protruding from the substrate. The active region of the substrate may include first and second impurity regions located on either side of the at least one gate structure, and the semiconductor device may further include a first contact pad contacting the first impurity region.

The at least one gate structure may include a gate electrode located in and protruding out of the substrate, a spacer located between the gate electrode and the first contact pad, and a gate insulation layer located between the gate electrode and the active region.

The spacer may extend below an upper surface of the substrate to be located between the gate electrode and the gate insulation layer.

The gate insulation layer may include oxidized material of the active region.

The at least one gate structure may include at least a first gate structure located in a first recess and a second gate structure located in a second recess, each gate structure having a first side facing a first direction and a second side opposite the first side. The first impurity region may be located on the first side of the first gate structure, and the second impurity region may be located between the first and second gate structures. The semiconductor device may further include a third impurity region located on the second side of the second gate structure in the active region of the substrate.

The first contact pad may extend from the first impurity region over the isolation region, and the semiconductor device may further include a first contact plug to contact a surface of the first pad electrode above the isolation region.

The semiconductor device may further include a second pad electrode contacting the second impurity region. The second contact pad may extend from the first impurity region over the isolation region, and the semiconductor device may further include a second contact plug to contact a surface of the second pad electrode above the isolation region.

The semiconductor device may further include first and second capacitors connected to the first and second contact plugs, respectively.

The semiconductor device may further include a bit line structure directly contacting the second impurity region.

The bit line structure may include a bit line and a bit line contact directly contacting the second impurity region to connect the bit line to the second impurity region.

The gate structure may be located above an upper surface of the substrate. Alternatively, at least part of the gate structure may be located beneath a plane defined by an upper surface of the substrate.

Features and/or utilities of the present general inventive concept may also be realized by a computing device including at least one DRAM device and a controller to access data from and write data to the DRAM device. The DRAM device may include a semiconductor substrate including an active region and an isolation region, a gate structure located on the semiconductor substrate, first and second impurity regions located in a surface of the substrate on both sides of the gate structure, a pad electrode to contact the first impurity region of the semiconductor substrate, a bit line structure electrically connected to the second impurity region, a contact plug contacting the pad electrode, and a capacitor electrically connected to the contact plug.

The computing unit may further include an interface to receive data from and transmit data to the controller to access the DRAM device and a presentation device to output data from the DRAM device.

Features and/or utilities of the present general inventive concept may also be realized by a method of manufacturing a semiconductor device, including forming an active region and an isolation region in a substrate, forming a gate structure in the active region of the substrate, forming at least one impurity region in the active region of the substrate adjacent to the gate structure, and forming a pad electrode on the substrate to contact the first impurity region.

The gate structure is formed on a surface of the substrate within an area corresponding to the active region of the substrate. Alternatively, forming the gate structure may include forming a recess in the active region of the substrate and forming a gate structure in the recess.

The pad electrode may be formed to contact the first impurity region and the isolation region adjacent to the first impurity region.

The method may further include forming a contact plug to contact the pad electrode at a location above only the isolation region of the substrate.

As mentioned above, a semiconductor device according to some example embodiments includes the pad electrode provided on the upper surface of one impurity region in a transistor. Therefore, the contact plug makes contact with the pad electrode, not the active region in the substrate, to be connected to the impurity region. Further, the contact plug makes contact with the pad electrode that is positioned on an isolation region. Accordingly, damage to the substrate including the active region may be prevented, and thus, the junction leakage current in the active region of the substrate in the semiconductor device may be reduced.

Further, in a DRAM device including the transistor according to some example embodiments, the junction leakage current may be reduced to thereby provide excellent data retention characteristics.

Thus, a semiconductor device according to some example embodiments may be highly integrated and may have high performance characteristics. Further, the semiconductor device having high performance characteristics may be manufactured through simplified processes.

BRIEF DESCRIPTION OF THE DRAWINGS

The above and/or other aspects of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
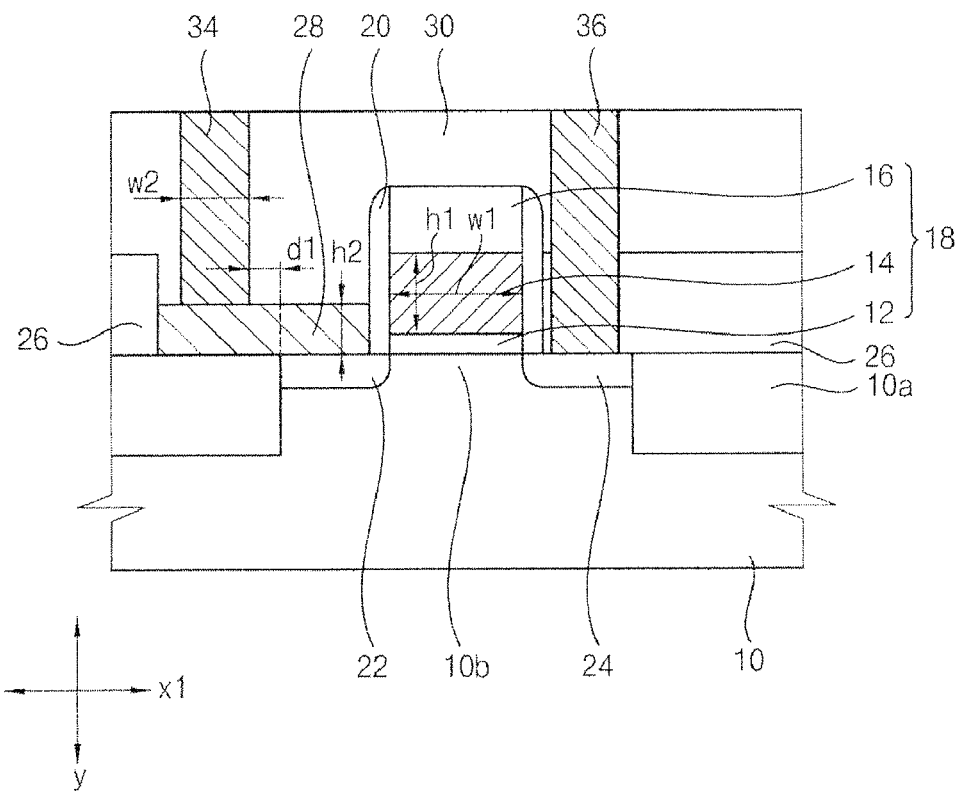
FIG. 1 is a cross-section view illustrating a semiconductor device in accordance with an example embodiment.

Various example embodiments will be described more fully hereinafter with reference to the accompanying drawings, in which some example embodiments are shown. The present general inventive concept may, however, be embodied in many different forms and should not be construed as limited to the example embodiments set forth herein. Rather, these example embodiments are provided so that this disclosure will be thorough and complete, and will fully convey the scope of the present general inventive concept to those skilled in the art. In the drawings, the sizes and relative sizes of layers and regions may be exaggerated for clarity. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a cross-section view illustrating a semiconductor device in accordance with an example embodiment of the present general inventive concept.

A semiconductor substrate 10 having an isolation region 10a and an active region 10b is provided. For example, the semiconductor substrate 10 may include single-crystalline silicon. While the numeral 10b points to one part of the active region 10b, the active region 10b may encompass the entire area of the substrate that is not the isolation region 10a.

A gate structure 18 including a gate insulation layer 12, a gate electrode 14, and a hard mask pattern 16 is provided on the active region 10b. A spacer 20 is provided on both sides of the gate structure 18.

First and second impurity regions 22 and 24 are provided in the substrate 10 adjacent to the gate structure 18 to serve as a source/drain. The first impurity region 22 is provided in the substrate adjacent to a first sidewall of the gate structure 18. The second impurity region 24 is provided in the substrate adjacent to a second sidewall of the gate structure 18. In other words, if a cross-section of an upper surface of the substrate 10 extends in a first direction $x_1$, the first and second impurity regions 22, 24 are located within the substrate 10 and each extends in the direction $x_1$. The first and second impurity regions 22, 24 may be separated from each other by a portion of the active region 10b located beneath the gate electrode 14. The gate electrode 14 may have a width $w_1$ so that the first and second impurity regions 22, 24 are separated from each other by a distance $w_1$ in the direction $x_1$.

In addition, the first and second impurity regions 22, 24 may each abut the isolation region in the direction $x_1$. The first and second impurity regions 22, 24 may also abut the active region 10b in the direction y perpendicular to the direction $x_1$, so that each impurity region may be surrounded by a combination of the isolation region 10a, the active region 10b, and the surface of the substrate 10.

The first and second impurity regions 22, 24 may contact the spacer 20 in the direction y.

A pad electrode 28 is provided on a surface of the substrate adjacent to the first sidewall of the gate structure 18. The pad electrode 28 faces an upper surface of the first impurity region 22 in the direction y and extends to the isolation region 10a adjacent to the active region 10b having the first impurity region 22 therein. However, the pad electrode 28 may be positioned such that the active regions 10b are not connected to one another on the upper surface of the substrate 10 in the direction y by the pad electrode 28.

In other words, the pad electrode 28 contacts the first impurity region 22 in a direction y, perpendicular to the direction $x_1$. The pad electrode 28 also extends in the direction $x_1$ along the surface of the substrate 10 to cover an isolation region 10a of the substrate.

The pad electrode 28 may include the same material as the semiconductor substrate 10. For example, the pad electrode 28 may include single-crystalline silicon formed by a selective epitaxy growth process using the semiconductor substrate 10 as a seed. The pad electrode 28 including single-crystalline silicon may be doped with impurities having the same conductive type as the first and second impurity regions 22 and 24. Alternatively, the pad electrode 28 may include polysilicon doped with impurities. The pad electrode 28 may have a thickness or height $h_2$ less than a thickness or height $h_1$ of the gate electrode 14.

A portion of the sidewall of the pad electrode 28 may face the spacer 20 formed on the sidewall of the gate structure 18. Therefore, the pad electrode 28 may be electrically insulated from the gate structure 18 by the spacer 20.

Since a junction leakage current may influence the first impurity region 22 more than the second impurity region 24, the pad electrode 28 may contact only the first impurity region 22, or the impurity region that is more likely to be influenced by the junction leakage current.

A mask pattern 26 is provided to expose the pad electrode 28. An insulation interlayer 30 is provided on the mask pattern 26, the pad electrode 28, and the gate structure 18 to cover the gate structure 18.

A first contact plug 34 is provided to penetrate the insulation interlayer 30 to make contact with the upper surface of the pad electrode 28. The first contact plug 34 makes contact with the surface of the pad electrode 28 position on the isolation region. The first contact plug 34 may be separated from the first impurity region 22 by a distance $d_1$ in the direction $x_1$. The first contact plug 34 may also be separated from the isolation region 10a by a distance $h_2$ in the direction y. Distance $h_2$ may correspond to the thickness of the pad electrode 28, for example.

The first contact plug 34 may have a width or thickness $w_2$. The width may be calculated such that the first contact plug 34 is located only above the isolation region 10a and is separated from the first impurity region 22 by the distance $d_1$ in the direction $x_1$.

A second contact plug 36 is provided to penetrate the insulation interlayer 30 to make contact with the second impurity region 24 in the substrate.

The semiconductor device according to this embodiment includes the pad electrode 28 extending from the active region 10b having the first impurity region 22 to the isolation region 10a. Additionally, the contact plug 34 is provided on the surface of the pad electrode positioned over the isolation region 10a. Accordingly, the substrate surface of the active region 10b may be prevented from being damaged during formation of the first contact plug 34. Further, the pad electrode 28 is provided on the impurity region that is more relatively influenced by the junction leakage current, thus reducing the leakage current due to the surface damage of the semiconductor substrate including the impurity region. Therefore, the semiconductor device according this embodiment of the present general inventive concept may have excellent operating characteristics.

FIGS. 2A to 2D are cross-sectional views illustrating a semiconductor device in accordance with the embodiment illustrated in FIG. 1.

Figure 2A:
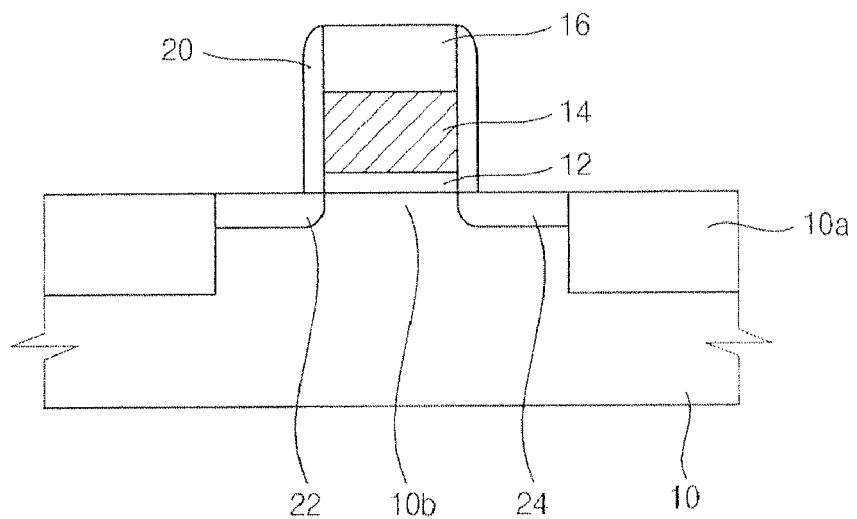
FIGS. 2A-2D are cross-sectional views illustrating a semiconductor device in accordance with the embodiment illustrated in FIG. 1.

Referring to FIG. 2A, a shallow trench isolation process is performed on a semiconductor substrate 10 to form an active region 10b and an isolation region 10a in the substrate. The active region 10b may have an isolated shape. In other words, the active region 10b may be entirely surrounded by the isolation region 10a along an upper surface of the substrate 10 in the direction y. Even if the active region 10b is surrounded by the isolation region 10a on the surface of the substrate 10, the active region 10b may extend below the isolation region 10a at a predetermined distance away from the surface of the substrate 10.

The active region 10b of the substrate 10 is thermally oxidized to form a gate insulation layer 12. A conductive layer and a hard mask pattern 16 are formed on the gate insulation layer 12 and then the conductive layer is patterned using the hard mask pattern 16 as an etching mask to form a gate electrode 14. Hereinafter, a structure of the gate insulation layer 12, the gate electrode 14 and the hard mask pattern 16 are referred to as a gate structure 18.

An insulation layer for a spacer (not illustrated) is formed on the gate structure 18 and the semiconductor substrate. The insulation layer for a spacer may be partially removed by an anisotropic etch process to form a spacer 20 on a sidewall of the gate structure 18.

Impurities are implanted under a surface of the semiconductor substrate 10 in both sides of the gate structure 18 to form a first impurity region 22 adjacent to a first side of the gate structure 18 and a second impurity region 24 adjacent to a second side of the gate structure 18.

Figure 2B:
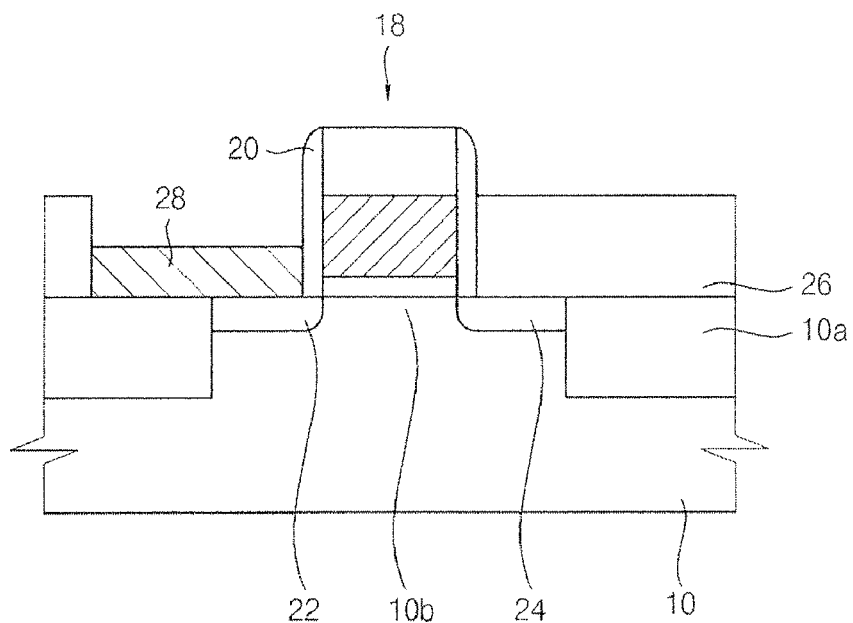

Referring to FIG. 2B, a mask pattern 26 is formed to selectively expose the semiconductor substrate 10 adjacent to a first sidewall of the gate structure 18. The mask pattern 26 may expose selectively a region for a pad electrode 28 to be formed. Accordingly, the exposing region of the mask pattern 26 may be a portion of the semiconductor substrate 10 of the active region 10b including the first impurity region 22 and the isolating region 10a adjacent to the active region 10b.

The mask pattern 26 may be formed using an insulating material. For example, silicon oxide may be deposited on the semiconductor substrate and patterned to form the mask pattern 26.

A selective epitaxy process is performed using the semiconductor substrate 10 exposed through the mask pattern 26 to form a pad electrode 28. Due to the sidewall overgrowth in the selective epitaxy process, the pad electrode 28 may be formed not only on the semiconductor substrate 10 of the active region 10b but also the isolation region 10a adjacent to the active region 10b.

Alternatively, a conductive material is deposited on the gate structure 18, and then is patterned such that the conductive material remains on the first impurity region 22 and the isolation region 10a adjacent to the first impurity region 22, to form the pad electrode 28. However, the processes for the deposition and patterning of the conductive material may be relatively complicated, and a bridge failure may occur due to a photo-misalignment in the patterning process.

Figure 2C:
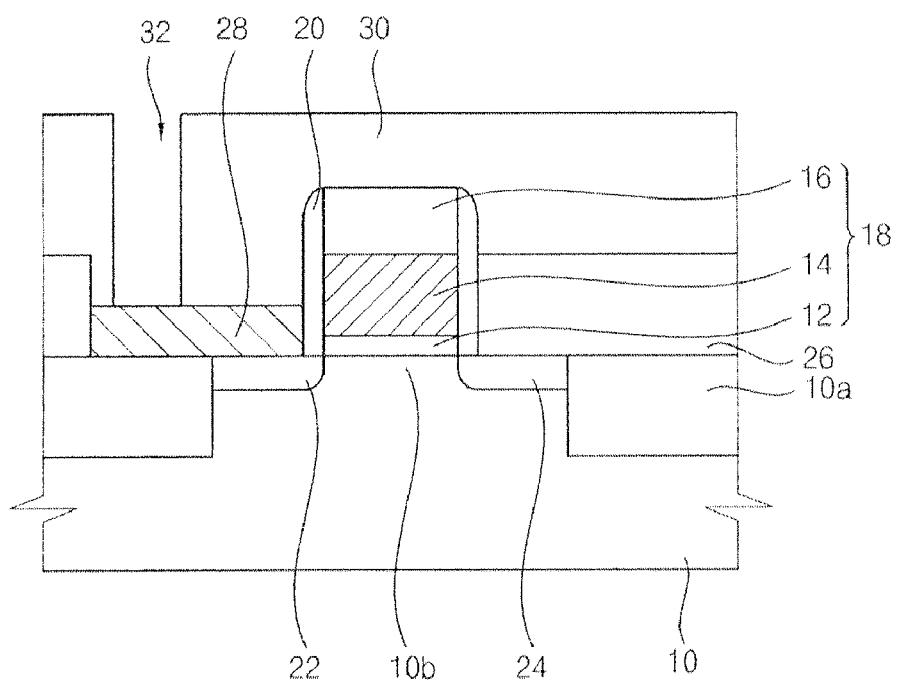

Referring to FIG. 2C, an insulation interlayer 30 is formed to cover the gate structure 18. The insulation interlayer 30 may be formed using silicon oxide by a chemical vapor deposition process.

The insulation interlayer 30 is partially removed until an upper surface of the pad electrode 28 is exposed, to form a first contact hole 32. The first contact hole 32 may be formed on the upper surface of the pad electrode 28 positioned on the isolation region 10a.

A dry etch process may be performed to form the first contact hole 32. The dry etch process may be performed using plasma of high energy to generate ion bombardment on the object layer. Accordingly, the etch object layer and an underlying layer may be damaged while performing the dry etch process. Further, to prevent the opening failure for a contact plug, although the object layer is removed completely, the underlying layer may be partially removed, and thus the underlying layer may be damaged more by the dry etch process. On the other hand, when a etch process is performed to form a contact hole exposing a semiconductor substrate, a damage such as pitting may be likely to occur in the semiconductor substrate, and thus undesired charge trap sites may be formed to cause leakage current.

However, in this embodiment, when the first contact hole 32 is formed, the surface of the semiconductor substrate 10 is not exposed, but the upper surface of the pad electrode 28 positioning on the isolation region 10a is exposed. Accordingly, the substrate surface of the active region may not be damaged by the ion bombardment in the dry etch process to form the first contact hole.

Figure 2D:
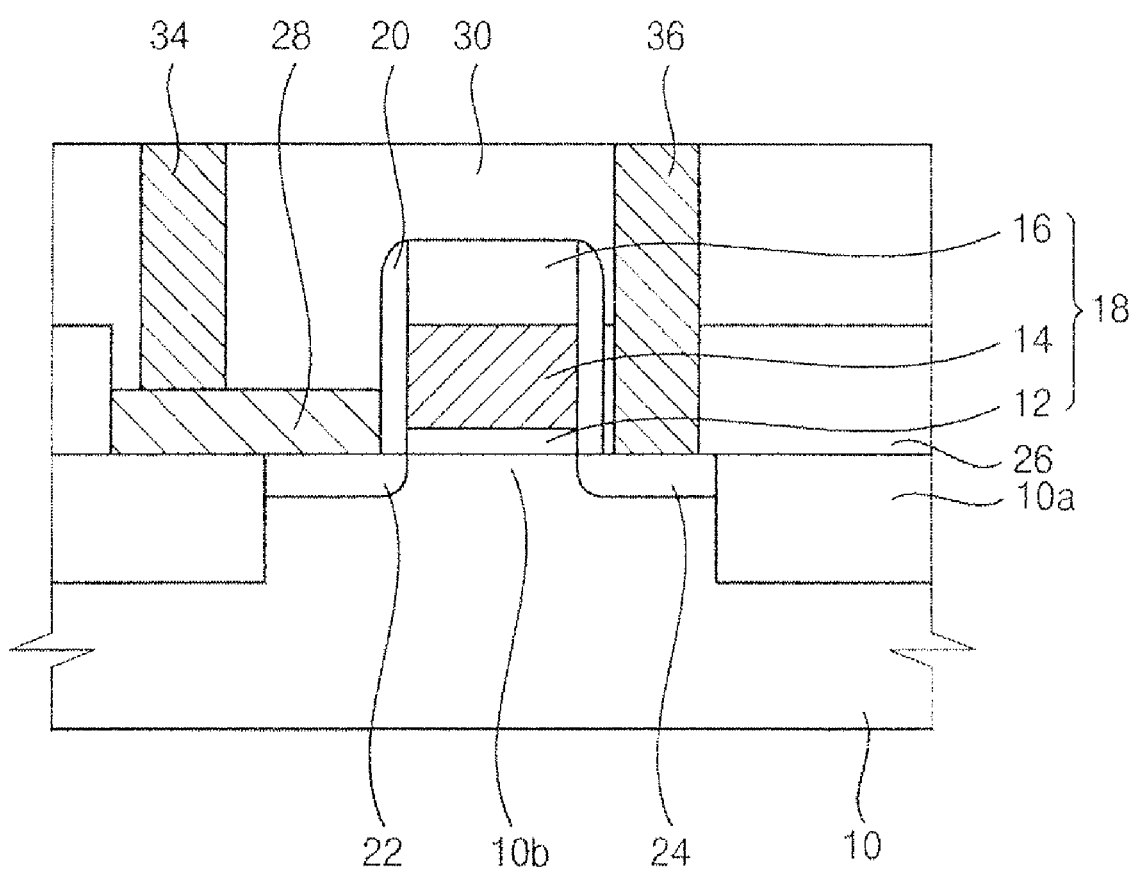

Referring to FIG. 2D, a first conductive layer (not illustrated) may be formed to fill the first contact hole 32. Then, the first conductive layer is planarized until the upper surface of the insulation interlayer 30 is exposed, to form a first contact plug 34.

The insulation interlayer is partially etched to form a second contact hole exposing the surface of the second impurity region 24 in the semiconductor substrate 10. A second conductive layer may be formed to fill the second contact hole. Then, the second conductive layer is planarized until the upper surface of the insulation interlayer 30 is exposed, to form a second contact plug 36.

Figure 3:
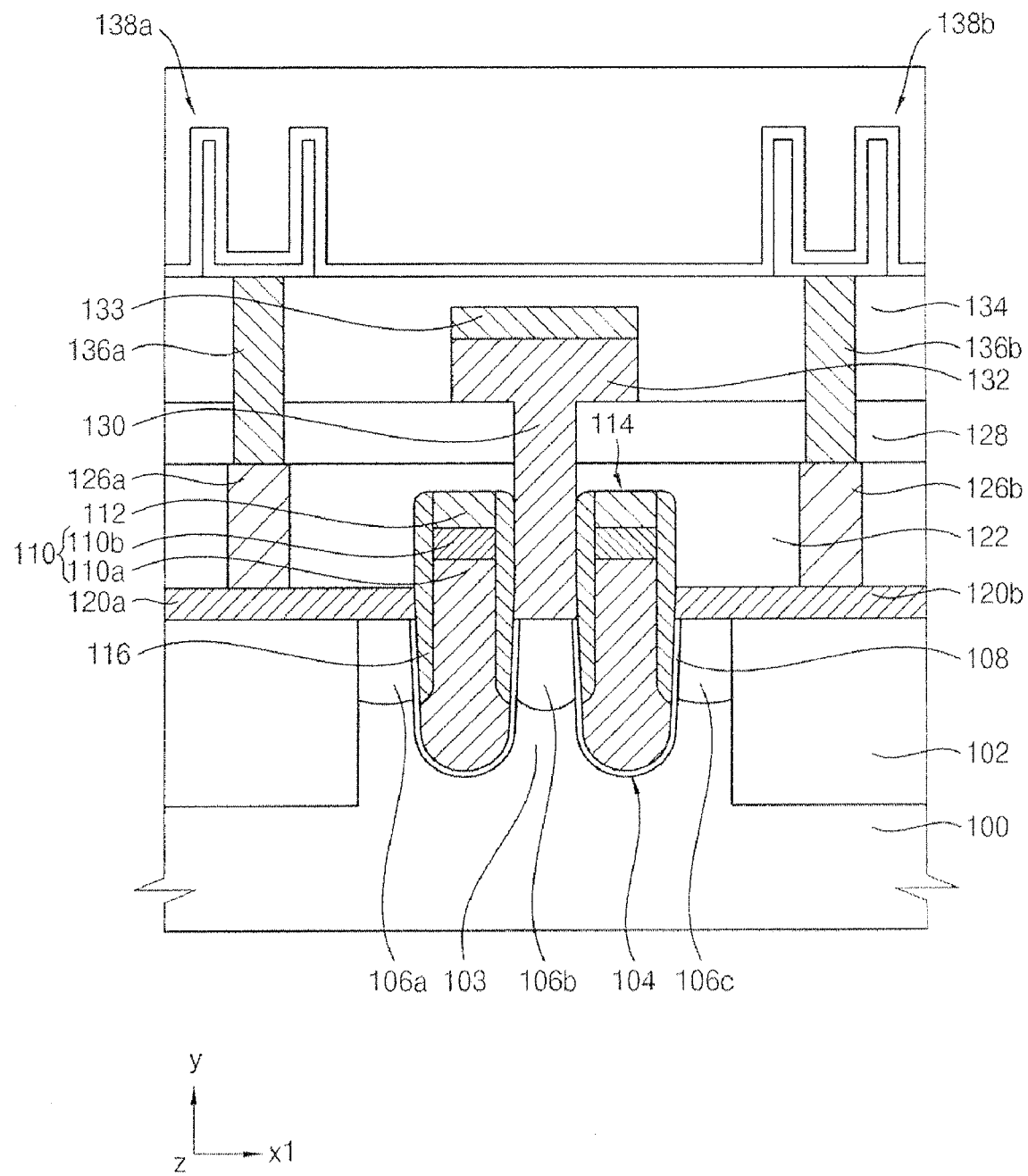
FIG. 3 is a cross-sectional view illustrating a DRAM cell in accordance with an embodiment of the present general inventive concept.
Figure 4A:
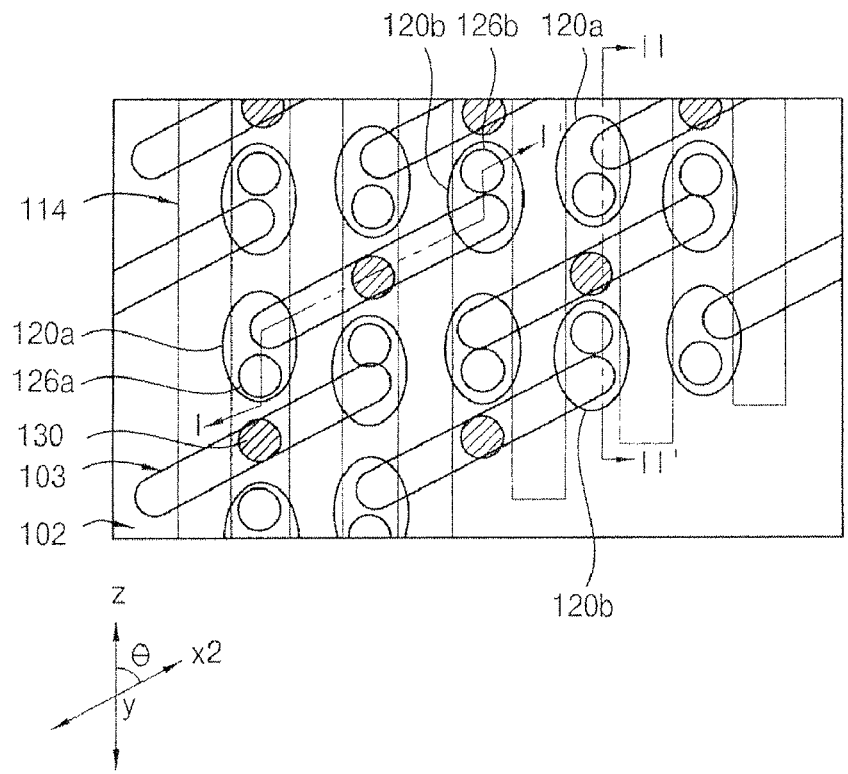
FIG. 4A is a plan view illustrating a DRAM cell in accordance with an embodiment of the present general inventive concept.
Figure 4B:
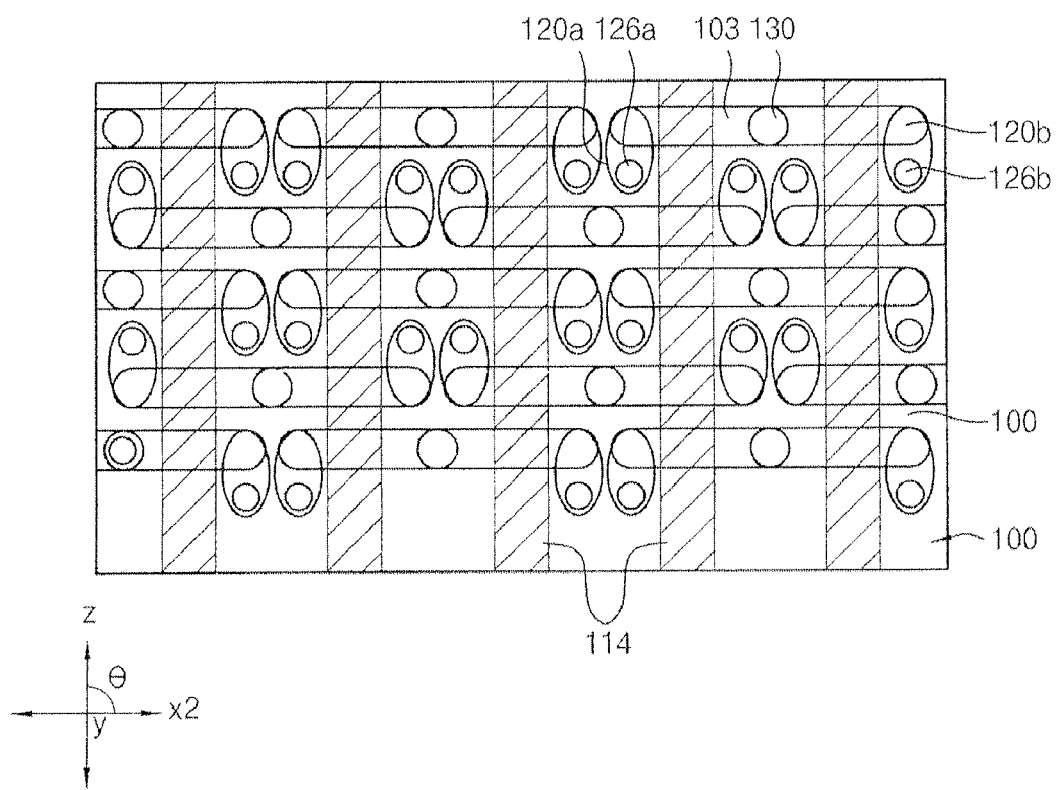
FIGS. 4B and 4C illustrate alternative configurations of the DRAM cell of FIG. 4A.
Figure 4C:
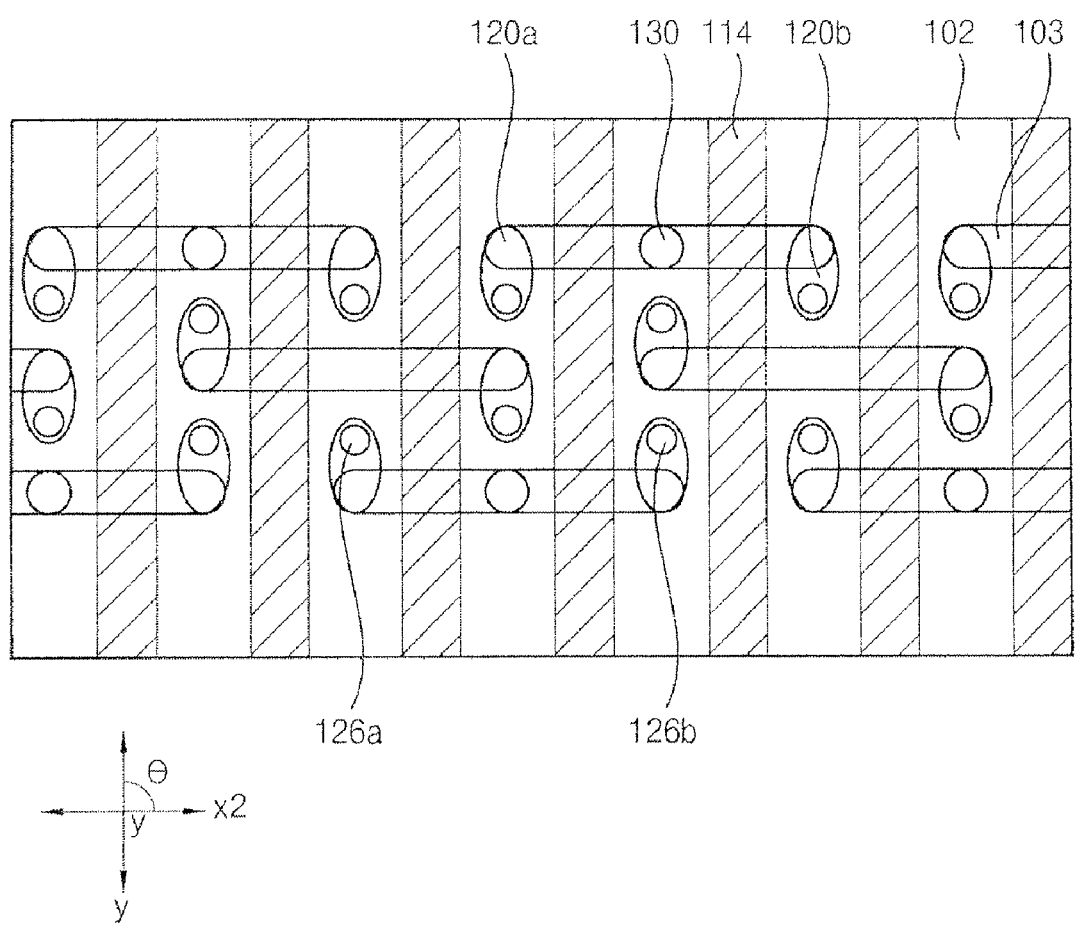

FIG. 3 is a cross-sectional view illustrating a DRAM cell in accordance with an example embodiment of the present general inventive concept. FIG. 4A is a plan view illustrating a DRAM cell in accordance with the example embodiment illustrated in FIG. 3. FIGS. 4B and 4C illustrate an alternative configuration of the DRAM cell of FIG. 4A.

FIG. 3 is a cross-section view taken along the line I-I' in FIG. 4A.

Referring to FIGS. 3-4C, a semiconductor substrate 100 having an active region 103 and an isolation region 102 is provided. The semiconductor substrate 100 may include single-crystalline silicon. The isolation region 102 may be formed by a shallow trench isolation process. The active regions 103 have isolated shapes are arranged repeatedly. In other words, multiple active regions 103 are separated from each other and are formed in a repeating pattern as seen from an upper surface of the substrate 100.

A recess portion 104 to form a gate electrode is provided in the active region 103. Two recess portions 104 may be provided in one active region.

If a surface of the substrate 100 extends in a direction $x_1$ in a cross-sectional view along line I-I' of FIG. 4A, and a direction y is perpendicular to the direction x, then the active region 103 is adjacent to the isolation region 102 in the direction $x_1$ along the surface of the substrate. The recess portion 104 is located in the active region 103 between isolation regions 102 along a surface of the substrate 100 and extending below the surface of the substrate 100.

The recess portion 104 may have a shape crossing from one side of the active region 103 to the other. The isolation region 102 may be provided in both sides of the recess portion 104 in a direction perpendicular to a channel direction of a transistor. The semiconductor substrate may be exposed between both sides of the recess portion 104 and the isolation region 102.

A gate structure 114 is provided in the recess portion to protrude from the surface of the semiconductor substrate 100. The gate structure 114 includes a gate insulation layer 108 provided on sidewalls of the recess portion, a gate electrode 110 provided on the gate insulation layer 108 and completely filling the recess portion and a hard mask pattern 112 provided on the gate electrode 110. The gate electrode 110 may have a stacked structure of a polysilicon pattern and a metal pattern or of a polysilicon pattern and a metal silicide pattern. For example, the gate electrode 110 may include a first portion 110a that extends beneath an upper surface of the substrate 100 and a second portion 110b that extends from the first portion 110a to the hard mask pattern 112 in the direction y. The gate electrode 110 may also include additional stacked layers, as desired.

Referring to FIG. 4A, the gate structure 114 may be formed to extend in a direction that forms an angle of smaller than 90° with the extending direction of the active region 103, as viewed from an upper surface of the substrate 100. Accordingly, the gate structure 114 and the active region 103 may be formed to extend at an acute angle to each other, to thereby highly integrate a semiconductor device. Alternatively, the gate structure 114 and the active region 103 may be formed to extend at a right angle to each other, as illustrated in FIGS. 4B and 4C.

In other words, as illustrated in FIGS. 4A-4C, direction z indicates a direction of the recess 104 and gate structure 114 through the active region 103. Direction z is perpendicular to direction y illustrated in FIG. 3. In FIG. 4A, direction z forms an acute angle θ with respect to direction $x_2$. Direction $x_2$ is defined as the direction of the line I-I' only in the center portion of the active region 103. For example, angle θ may be 30° so that the active regions 103 are tilted 30° with respect to gate structures 114. However, direction z may also be perpendicular to direction $x_2$, as shown in FIGS. 4B and 4C.

A spacer 116 is provided on both sides of the gate structure 114. The spacer 116 may include an insulating material. For example, the spacer 116 may include silicon nitride.

As illustrated in the figures, a lower portion of the spacer 116 may be positioned within the recess 104. In this case, an upper width of the gate electrode 110 may be smaller than a width of the recess portion 104. Further, because the spacer 116 is not provided on the upper surface of the semiconductor substrate 100, an area of the active region for a contact to be formed may be increased.

The gate electrode 110 may have a length that extends in the direction y from within the active region 103 of the substrate 100 above the upper surface of the substrate 100.

Alternatively, the lower portion of the spacer 116 may be provided on the upper surface of the semiconductor substrate 100. In this case, the width of the gate electrode 110 may be increased relatively.

Impurity regions are provided in the semiconductor substrate 110 in both sides of the gate structure 110 to serve as a source/drain. First and third impurity regions 106a and 106c may be connected to capacitors 138a, 138b. The second impurity region 106b may be connected to a bit line 132. The second impurity region 106b may be positioned between two gate structures 114 in the unit active region 103. The first and third impurity regions 106a and 106c may be positioned in peripheral regions of the unit active region 103.

The spacer 116 of the gate structure 114 may extend from the hard mask pattern 112 at the upper end of the gate structure 114 in the direction y into the recess 104. The spacer 116 may extend below the surface of the substrate 100 to a depth below a lower edge of the first, second, and third impurity regions 106a, 106b, 106c. In other words, the spacer 116 may be located between the impurity regions 106a-c and the gate electrode 110 in the direction x.

A first pad electrode 120a is provided to make contact with the first impurity region 106a and extend to an upper surface of the isolation region 102 adjacent to the first impurity region 106a. A second pad electrode 120b is provided to make contact with the second impurity region 106c and extend to an upper surface of the isolation region 102 adjacent to the third impurity region 106c. On the other hand, the pad electrode is not provided on the second impurity region 106b. The pad electrodes are provided on the first and third impurity regions 106a and 106c connected to the capacitors 138a, 138b.

The first and second pad electrodes 120a and 120b may include the same semiconductor material. For example, the pad electrodes 120a and 120b may include single-crystalline silicon formed through a selective epitaxy growth process using the semiconductor substrate 100 as a seed.

The gate electrode 110 of the gate structure 114 may have a length in the direction y longer than a combined length in the direction y of one of the pad electrodes 120a, 120b and any one of the first, second, or third impurity regions 106a-c.

A first insulation interlayer 122 is provided to cover the gate structure 114.

A first contact plug 126a is provided to penetrate the first insulation interlayer 122 and make contact with an upper surface of the first pad electrode 120a. The first contact plug 126a makes contact with the surface of the first pad electrode 120a positioned on the isolation region 102. A second contact plug 126b is provided to penetrate the first insulation interlayer 122 to make contact with an upper surface of the second pad electrode 120b. The second contact plug 126b makes contact with the surface of the second pad electrode 120b positioned on the isolation region 102.

A second insulation interlayer 128 is provided on the first insulation interlayer 122 where the first and second contact plugs 126a and 126b are formed. A bit line contact 130 is provided to penetrate the second and first insulation interlayers 128 and 122 and make contact with the upper surface of the second impurity region 106b in the semiconductor substrate. A bit line 132 is provided the second insulation interlayer 128 to make contact with the bit line contact 130. A hard mask pattern 133 is provided on the bit line 132.

A third insulation interlayer 134 is provided on the second insulation interlayer 128 to cover the bit line 132. First and second storage node contacts 136a and 136b are provided to penetrate the third insulation interlayer 134 and the second insulation interlayer 128 and make contact with the first and second contact plugs 126 and 126b, respectively.

First and second capacitors 138a and 138b are provided on the first and second storage contacts 136a and 136b, respectively.

The DRAM cell includes two unit cells in one isolated active region. In the DRAM cell, the contact plug electrically connected to the capacitor may not directly contact the substrate surface. Accordingly, the substrate surface may not be damaged while forming the contact plug, and thus, the junction leakage current in the DRAM cell may be reduced. Further, data retention time may be increased due to the reduction of the leakage current and thus a required frequency of a refresh cycle in the DRAM cell may be reduced.

Since the capacitor stores electrical charges, if the semiconductor substrate to be connected to the capacitor is damaged to cause the junction leakage current, the data retention time may be reduced greatly. On the other hand, since the bit line inputs and outputs signals, damage to the semiconductor substrate connected to the bit line may have relatively little effect on the operation of the DRAM cell. Therefore, in this embodiment, although the bit line contact directly contact the semiconductor substrate such as the second impurity region, leakage of stored charges may be minimized or prevented altogether. Further, the pad is not provided on the second impurity region to thereby highly integrate the DRAM cell.

Therefore, according to this embodiment, the DRAM cell may have excellent refresh characteristics and be highly integrated.

FIGS. 5A to 9 are cross-sectional views and plan views illustrating a method of forming the DRAM cell in FIG. 3.

The A-figures of FIGS. 5A to 8A are cross-sectional views taken along the line I-I' in FIGS. 5B-8B, respectively. FIG. 9 is a cross-sectional view taken along the line I-I' of FIG. 4A. The B-figures of FIGS. 5B-8B are plan views illustrating the DRAM cell. The C-figures of FIGS. 5C-7C are cross-section views taken along the line II-II' in FIGS. 5B-7C, respectively.

Figure 5A:
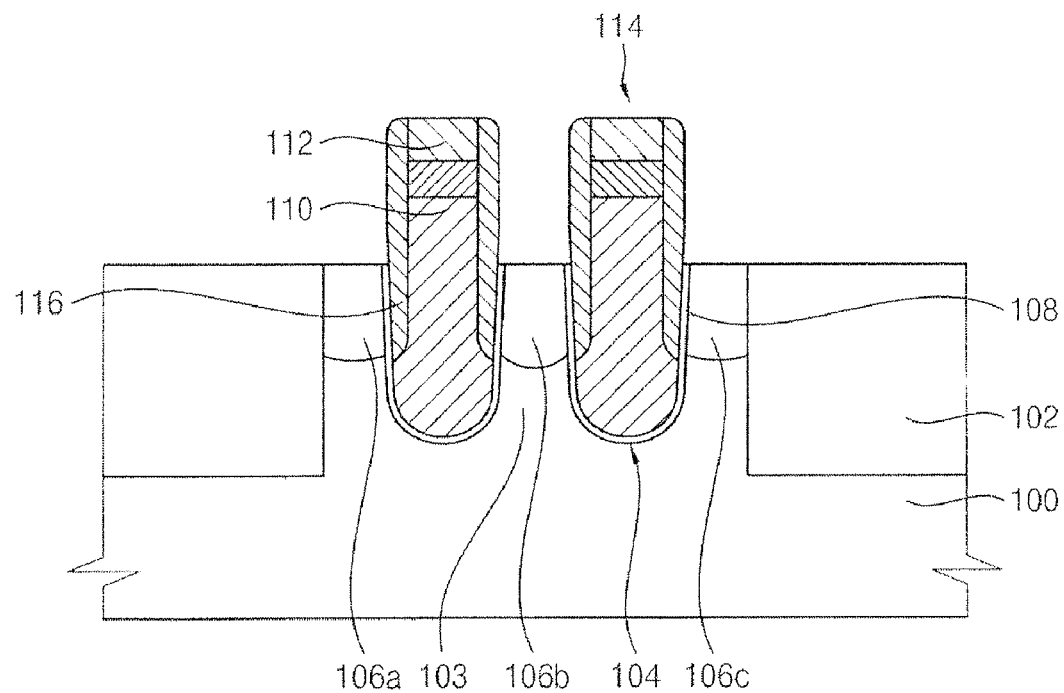
FIGS. 5A, 5C, 6A, 6C, 7A, 7C, 8A, and 9 are cross-sectional views illustrating a method of forming the DRAM cell in FIG. 4A.
Figure 5B:
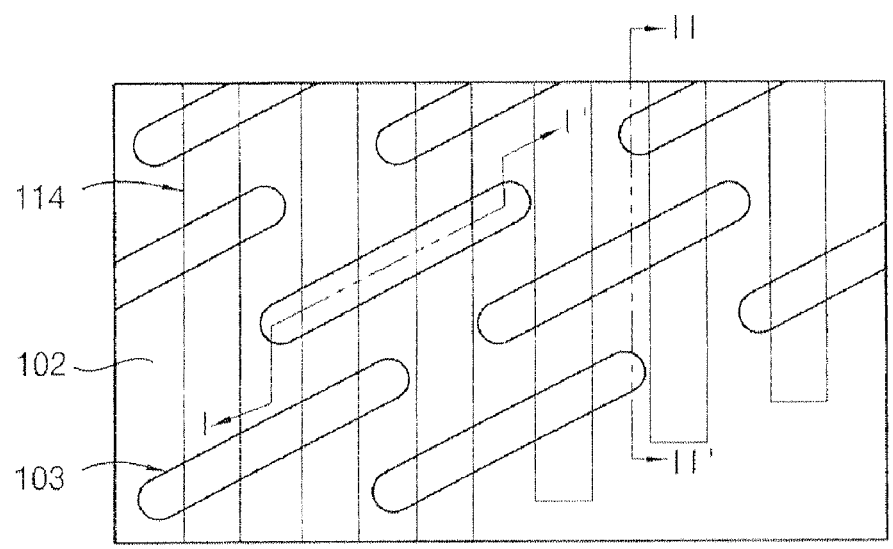
FIGS. 5B, 6B, 7B, and 8B are plan views illustrating a method of forming the DRAM cell of FIG. 4A.
Figure 5C:
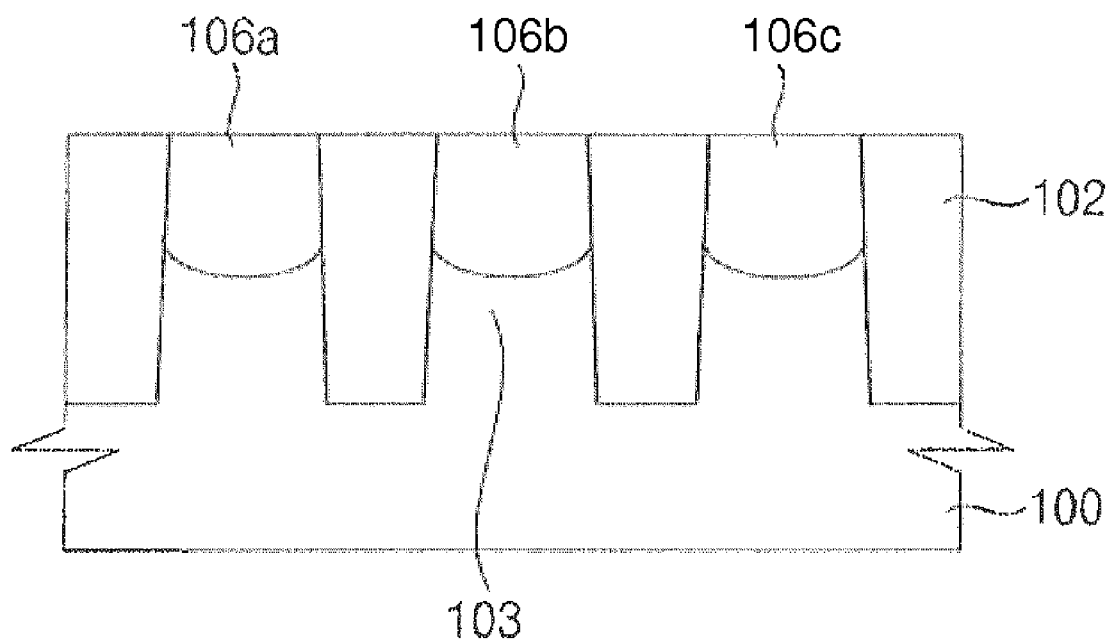

Referring to FIGS. 5A to 5C, a shallow trench isolation process is performed on a semiconductor substrate 100 to form an active region 103 and an isolation region 102 in the substrate. The active regions 103 may be isolated from one another and may be arranged in a repeating pattern on the substrate 100.

After forming the active region 103, impurity doping process is performed to form a preliminary impurity region (not illustrated). Additionally, a channel doping process may be performed to control a threshold voltage of a transistor.

A portion of the semiconductor substrate 100 including the active region 103 is etched to form a recess portion 104. Two recess portions 104 may be formed in one isolated active region. By forming the recess portion 104, the preliminary impurity region is divided into first to third impurity regions 106a, 106b and 106c. In here, the first and third impurity regions 106a and 106c are regions to be connected to capacitors, and the second impurity region 106b is a region to be connected to a bit line.

In particular, a hard mask pattern (not illustrated) is formed on the semiconductor substrate 100 including the active region 103 and the isolation region 102, to selectively expose a region to form a gate structure. The semiconductor substrate is etched using the hard mask pattern as an etching mask to form the recess portion 104. The recess portion 104 has a shape crossing the active region 103. The recess portion 104 may be formed to extend in a direction that forms an angle of smaller than 90° with the extending direction of the active region 103. Alternatively, the recess portion 104 and the active region 103 may be formed to extend at a right angle to each other.

A gate structure 114 is formed in the recess portion 104.

Sidewalls of the recess portion 104 are oxidized to form a gate insulation layer 108. A conductive layer filling the recess portion 104 and a hard mask pattern 112 is formed on the gate insulation layer 108, and the conductive layer is patterned using the hard mask pattern 112, to form the gate structure 114 of a stacked structure including the gate insulation layer 108, a gate electrode 110 and the hard mask pattern 112. The conductive layer may be formed by depositing polysilicon and metal silicide. Alternatively, the conductive layer may be formed by depositing polysilicon and metal. The conductive layer may be formed by depositing polysilicon.

In this embodiment, the hard mask pattern 112 may be formed to have a width smaller than that of the recess portion 104, to form a gap between the gate structure 114 and the sidewall of the recess portion 104.

Alternatively, the hard mask pattern 112 may be formed to have a width the same as or greater than that of the recess portion 104, to completely fill the recess portion 104. In this case, a gap may not be formed between the gate structure 114 and the sidewall of the recess portion 104.

Figure 6A:
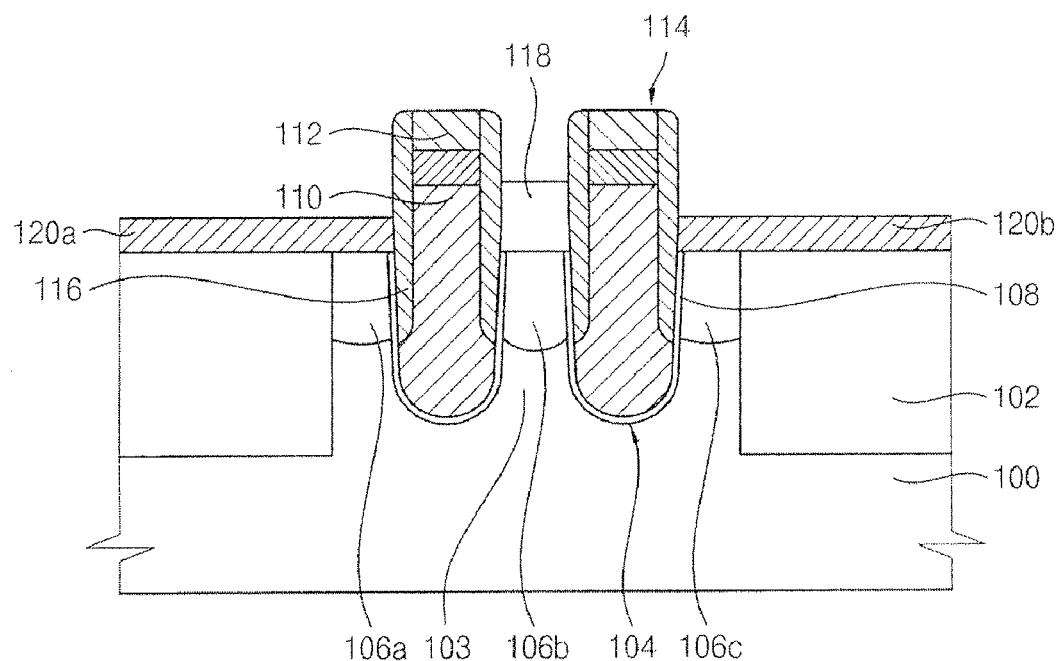
Figure 6B:
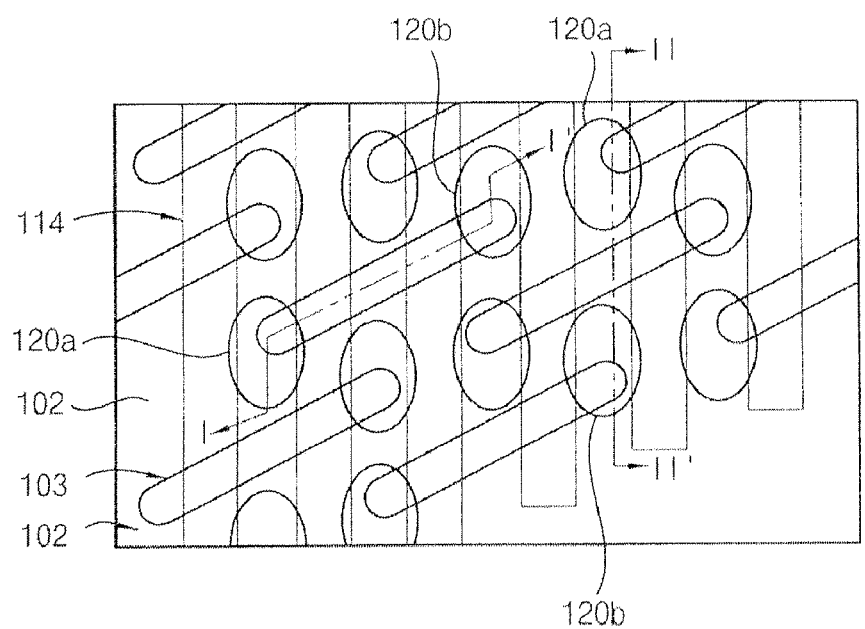
Figure 6C:
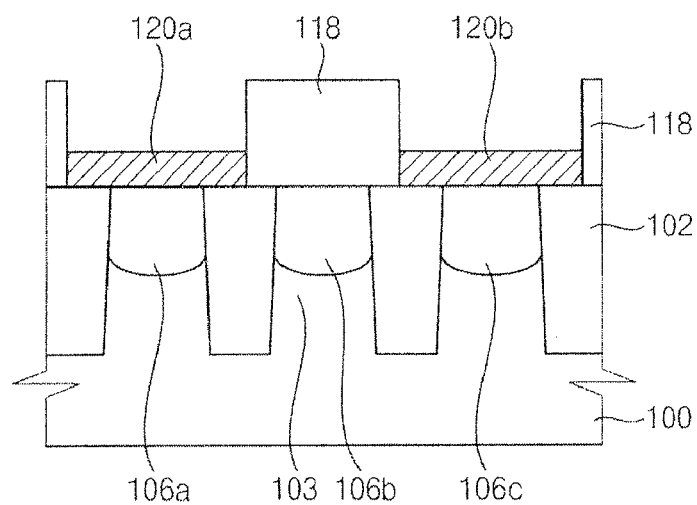

Referring to FIGS. 6A to 6C, a mask pattern 118 is formed to cover the active region 103 between the gate structures 114. The mask pattern 118 may have a shape that selectively expose peripheral regions of the active region 103 and the isolation region 102 facing with the active region 103. The mask pattern 118 may include an insulation material. For example, the mask pattern may include silicon oxide.

Then, a selective epitaxy growth process is performed using a surface of the semiconductor substrate exposed through the mask pattern 118, to form first and second pad electrodes 120a and 120b, respectively. For example, the first and second pad electrodes 120a and 120b may include single-crystalline silicon. In the selective epitaxy growth process, the pad electrodes 120a and 120b are overgrown laterally from the semiconductor substrate such that the first and second pad electrodes 120a and 120b are formed not only on the active region 103 in the semiconductor substrate 100 but also the isolation region 102 adjacent to the active region 103. The first and second pad electrodes 120a and 120b are formed to make contact with the active region 103 to be electrically connected to a capacitor in a DRAM cell.

Figure 7A:
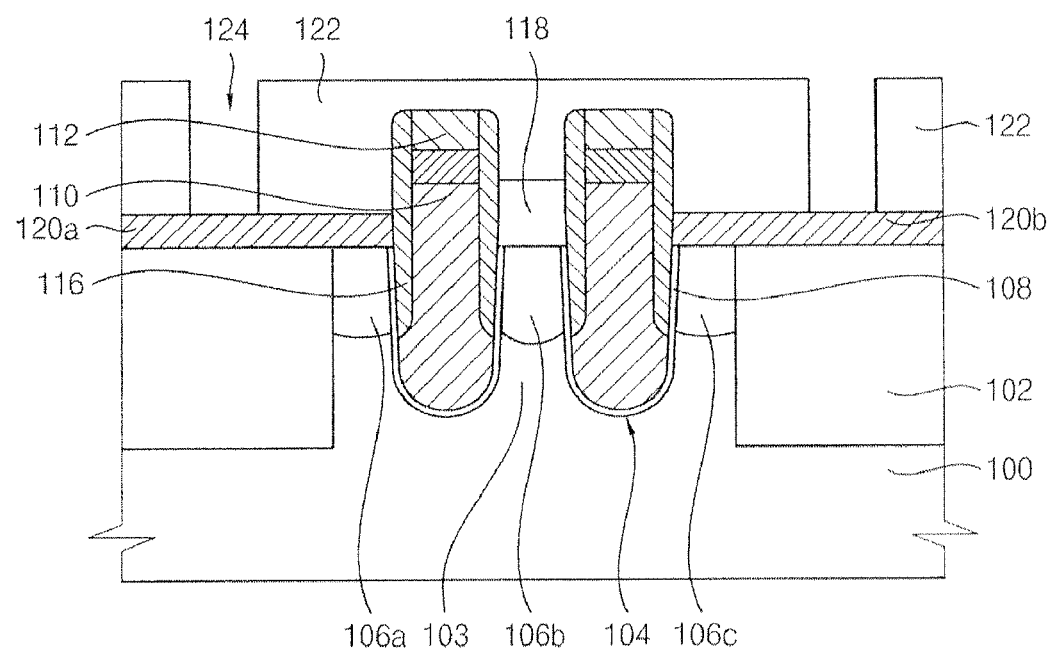
Figure 7B:
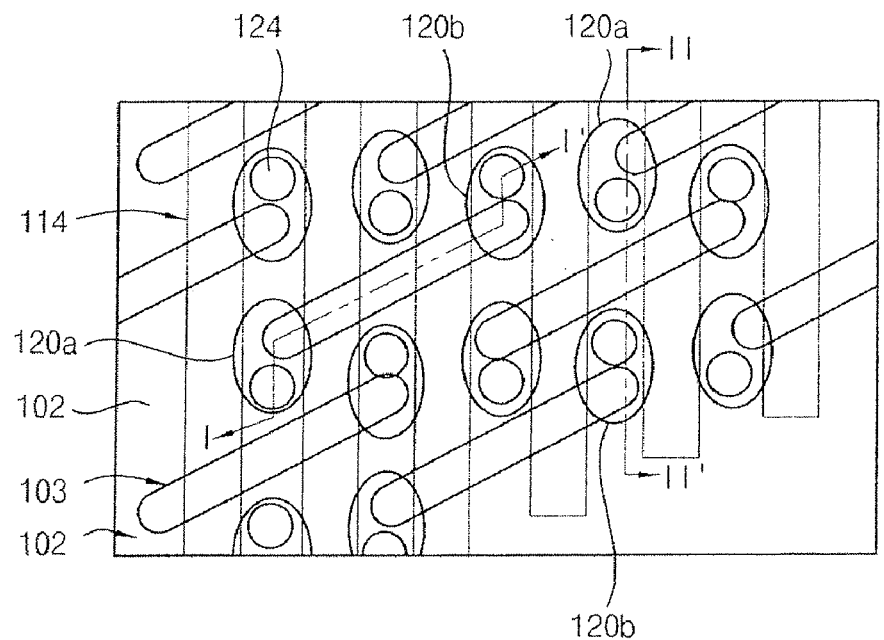
Figure 7C:
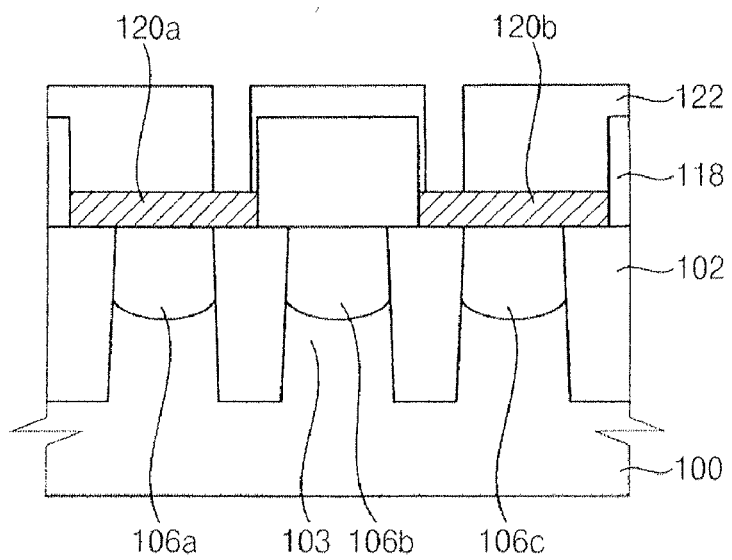

Referring to FIGS. 7A to 7C, a first insulation interlayer 122 is formed to cover the gate structure 114. The first insulation interlayer 122 is partially etched to form contact holes 124 that expose upper surfaces of the first and second pad electrodes 120a and 120b, respectively. The contact holes 124 may be formed on the upper surfaces of the first and second pad electrodes 120a and 120b positioned on the isolation region 102.

The surface of the semiconductor substrate is not exposed through a bottom surface of the contact holes 124. Since the contact holes 124 expose the upper surfaces of the first and second pad electrodes 120a and 120b located on the isolation region 102, damage to the active region 103 during the etch process may be prevented. Further, an etching time to etch the first insulating interlayer 122 may be reduced compared with a conventional process of forming a contact hole that exposes the surface of the semiconductor substrate. Accordingly, as the etching time of the first insulation interlayer 122 is shortened, the damage to the semiconductor substrate 100 by the etch process may be reduced.

Figure 8A:
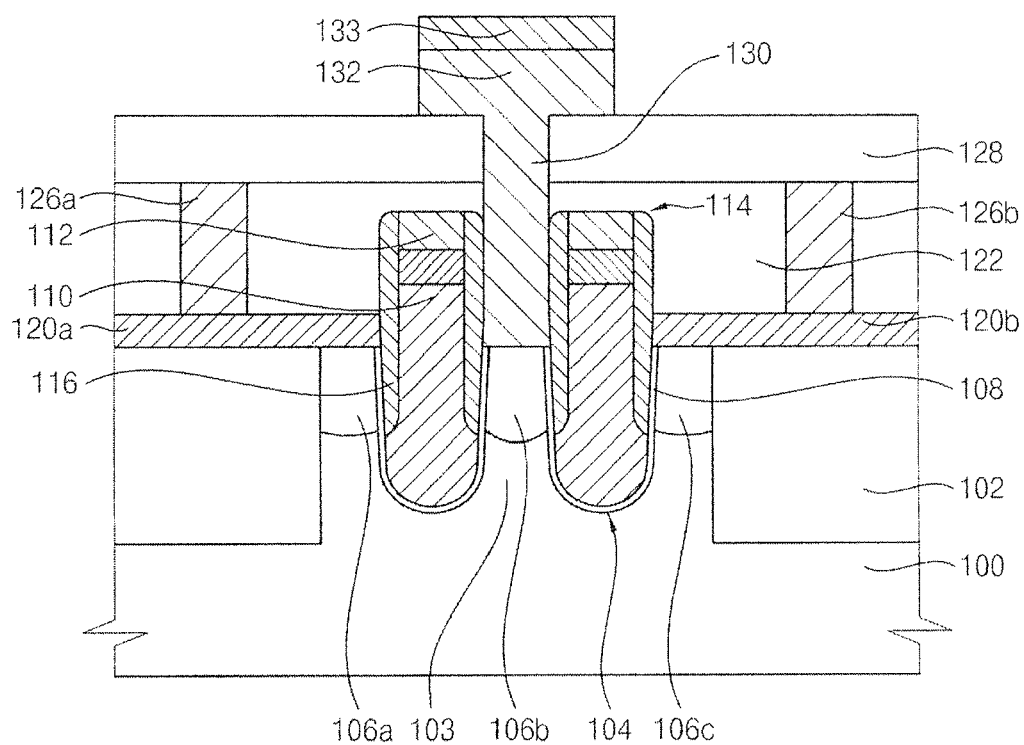
Figure 8B:
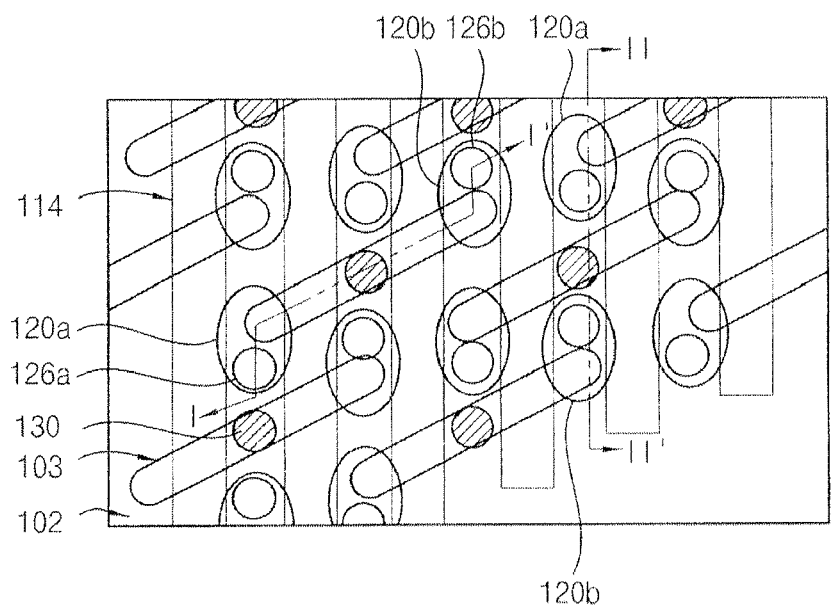
Figure 9:
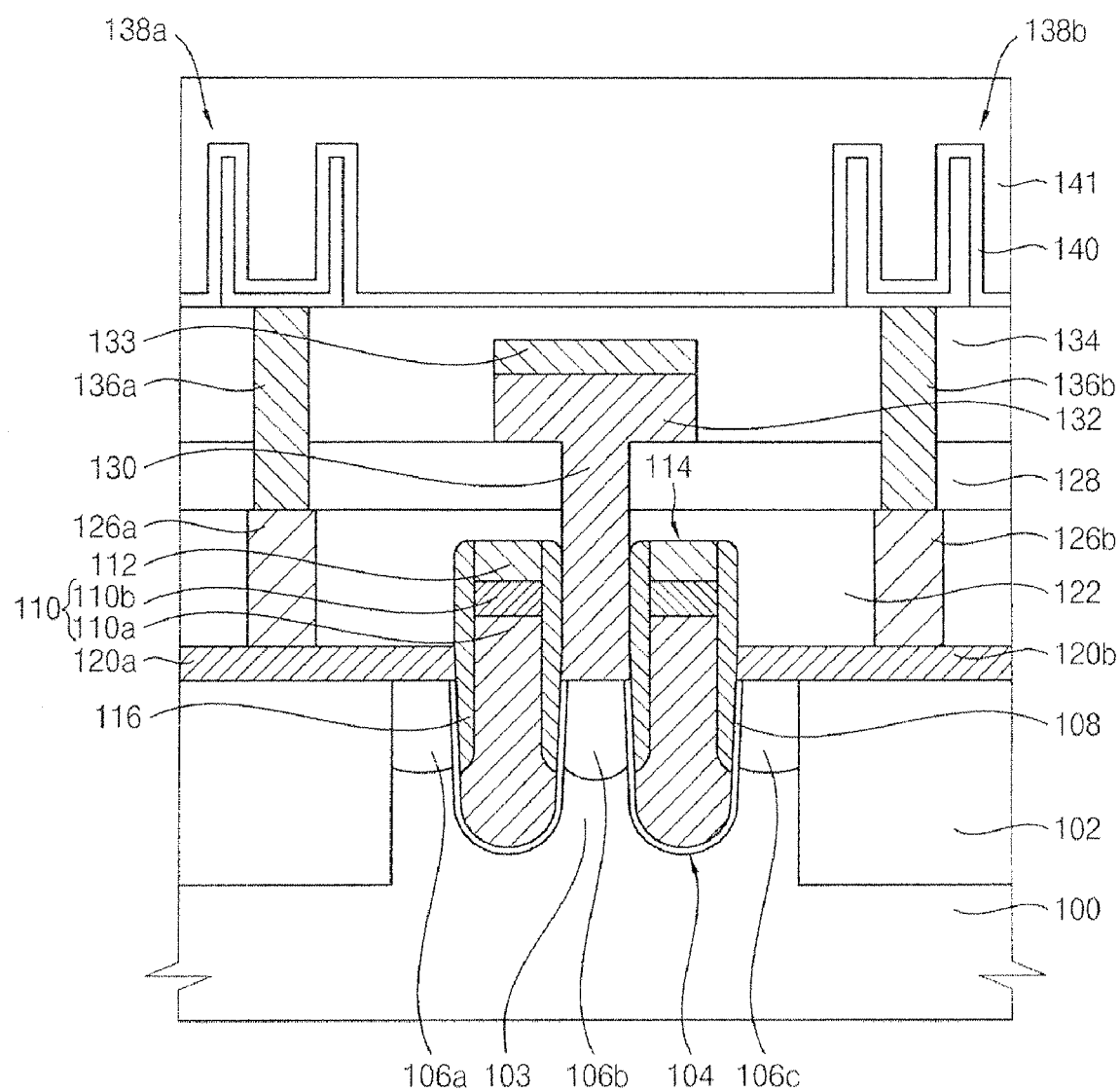

Referring to FIGS. 8A and 8B, a first conductive layer is formed to fill the contact holes 124. Then, the first conductive layer is planarized until an upper surface of the first insulation interlayer 122 is exposed, to form first and second contact plugs 126a and 126b that make contact with the first and second pad electrodes 120a and 120b, respectively.

A second insulation interlayer 128 is formed on the first insulation interlayer 122. The second insulation interlayer 128 and the first insulation interlayer 122 are partially etched to form a bit line contact hole that exposes the second impurity region 106b between the gate structures 114. The bit line contact hole exposes the surface of the semiconductor substrate 100 unlike the contact holes 124 in FIG. 7A.

A second conductive layer (not illustrated) is formed to fill the bit line contact hole. A hard mask pattern (not illustrated) is formed on the second conductive layer. The hard mask pattern faces with the bit line contact hole. The hard mask pattern has a shape extending in a direction perpendicular to the extending direction of the gate structure 114.

The second conductive layer is etched using the hard mask pattern as an etching mask, to form incorporated bit line contact 130 and bit line 132.

Referring to FIG. 9, a third insulation interlayer 134 is formed to cover the bit line 132. The third insulation interlayer 134 and the second insulation interlayer 128 are partially etched, to form first and second storage node contact holes that expose upper surfaces of the first and second contact plugs 126a and 126b, respectively. Then, the first and second storage node contact holes are filled with a conductive material to form first and second storage node contacts 136a and 136b.

Capacitors 138a and 138b of the DRAM device are formed on the first and second storage node contacts 136a and 136b, respectively. Insulation layers 140, 141 may be formed on the capacitors 138a, 138b and the third insulation interlayer 134 to seal and/or protect the semiconductor device. The insulation layers 140, 141 may provide thermal, electrical, and/or physical insulation.

According to the above-mentioned method, the damage to the substrate during forming the contact hole may be minimized, to thereby form the DRAM device without leakage current.

Figure 10:
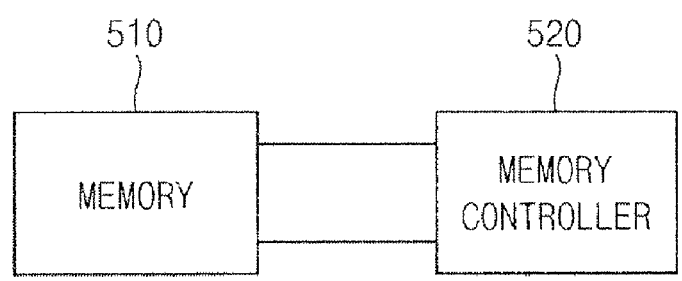
FIG. 10 illustrates an embodiment of the present general inventive concept.

FIG. 10 illustrates an embodiment of the present general inventive concept.

As illustrated in FIG. 10, this embodiment includes a memory 510 connected to a memory controller 520. The memory 510 may be the DRAM device discussed above. However, the memory 510 may be any DRAM device having the structures according to embodiments of the present general inventive concept. The memory controller 520 supplies the input signals to control operation of the memory 510. For example, the memory controller 520 supplies the command CMD and address ADD signals, I/O signals, etc. It will be appreciated that the memory controller 520 may control the DRAM device based on received signals.

Figure 11:
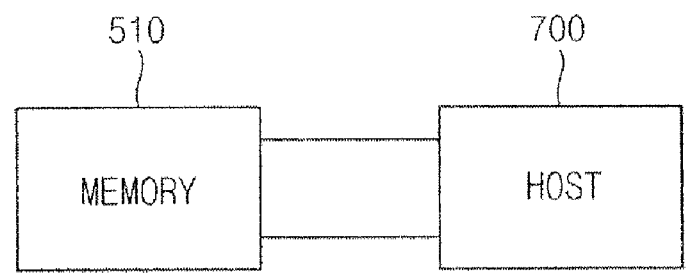
FIG. 11 illustrates an embodiment of the present general inventive concept.

FIG. 11 also illustrates an embodiment of the present general inventive concept.

The memory 510 may be connected with a host system 700. The memory 510 may be any DRAM device having the structures according to embodiments of the present general inventive concept. The host system 700 may include an electric product such as a personal computer, digital camera, mobile application, game machine, communication equipment, etc. The host system 700 supplies the input signals to control operation of the memory 510. The memory 510 is used as a date storage medium.

Figure 12:
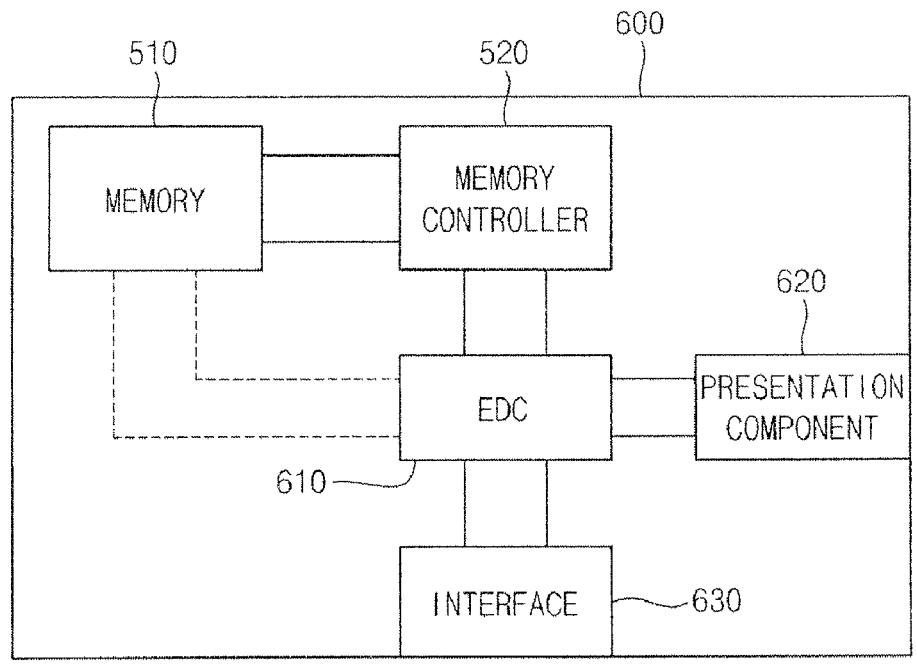
FIG. 12 illustrates an embodiment of the present general inventive concept.

FIG. 12 also illustrates an embodiment of the present general inventive concept. This embodiment represents a portable device 600. The portable device 600 may be an MP3 player, video player, combination video and audio player, etc. As illustrated, the portable device 600 includes the memory 510 and memory controller 520. The memory 510 may be any DRAM device having the structures according to embodiments of the present general inventive concept. The portable device 600 may also include an encoder/decoder EDC 610, a presentation component 620, and an interface 630. Data (video, audio, etc.) is input to and output from the memory 510 via the memory controller 520 via the EDC 610. The presentation component 620 may output a visual display or other output corresponding to data retrieved from the memory 510 or received via the interface 630. The interface 630 may be an electrical interface to receive electrical signals from another device, or an interface to receive a user input.

Figure 13:
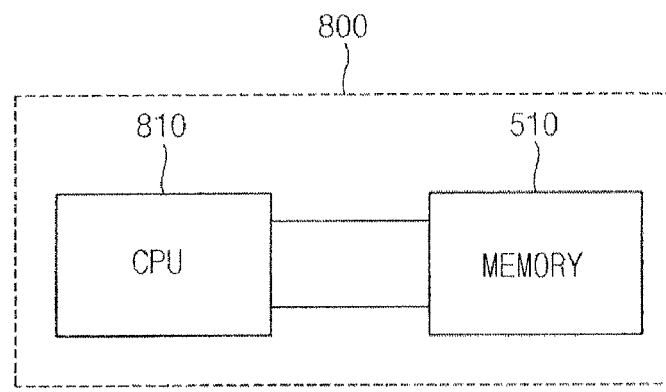
FIG. 13 illustrates an embodiment of the present general inventive concept.

FIG. 13 also illustrates an embodiment of the present general inventive concept. As illustrated, the memory 510 may be connected to a central processing unit CPU 810 within a computer system, or computing device, 800. For example, the computer system 800 may be a personal computer, personal data assistant, etc. The memory 510 may be directly connected with the CPU 810, connected via BUS, etc. The memory 510 may be any vertical-type non-volatile memory device having the structures according to embodiments of the present general inventive concept. It will be appreciated, that FIG. 13 does not illustrate the full complement of components that may be included within the computer system 800 for the sake of clarity.

As mentioned above, a transistor according to example embodiments may be applied to various semiconductor devices. The transistor may be used to serve as a selection transistor in a highly integrated DRM cell having excellent refresh characteristics.

The foregoing is illustrative of example embodiments and is to not be construed as limiting thereof. Although a few example embodiments have been described, those skilled in the art will readily appreciate that many modifications are possible in the example embodiments without materially departing from the novel teachings and advantages of the present general inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is to not be construed as limited to the specific example embodiments disclosed, and that modifications to the disclosed example embodiments, as well as other example embodiments, are intended to be included within the scope of the appended claims.

What is claimed is:

1. A DRAM device, comprising:
a semiconductor device, comprising:
a semiconductor substrate including an active region and an isolation region;
a gate structure located on the semiconductor substrate;
first and second impurity regions located in a surface of the semiconductor substrate on both sides of the gate structure;
a pad electrode to contact the first impurity region of the semiconductor substrate;
a bit line structure electrically connected to the second impurity region;
a contact plug contacting the pad electrode; and
a capacitor electrically connected to the contact plug,
wherein the pad electrode has a shape extending from the first impurity region of the active region to the isolation region adjacent to the active region.

2. The DRAM device of claim 1, wherein the pad electrode comprises a same semiconductor material as the semiconductor substrate.

3. The DRAM device of claim 1, wherein the contact plug contacts a surface of the pad electrode on the isolation region.

4. The DRAM device of claim 1, wherein the bit line structure comprises:
a bit line contact directly contacting an upper surface of the drain; and
a bit line contacting an upper surface of the bit line contact.

5. The DRAM device of claim 1, further comprising a spacer located on both sidewalls of the gate structure.

6. The DRAM device of claim 1, further comprising a second contact plug connecting the contact plug and the capacitor.

7. The DRAM device of claim 1, wherein a recess portion is formed in the active region of the semiconductor substrate, and the gate structure fills the recess portion and protrudes from the surface of the semiconductor substrate.

8. The DRAM device according to claim 1, wherein the semiconductor device includes a plurality of semiconductor devices,
the at least one gate includes a plurality of gates arranged in parallel in a first direction on the semiconductor substrate, and
each active region of the plurality of semiconductor devices is arranged so that an extending direction of the active region runs in a second direction that is not perpendicular to the first direction.

9. A semiconductor device, comprising:
a substrate having an active region and an isolation region;
at least one gate structure located in the active region of the substrate, at least one impurity region in the substrate adjacent to the gate structure and the isolation region; and a first pad electrode located on the at least one impurity region and the isolation region, wherein the at least one gate structure comprises:

a gate electrode located in and protruding out of the substrate;

a spacer located between the gate electrode and the first pad electrode; and a gate insulation layer located between the gate electrode and the active region, wherein the spacer extends below an upper surface of the substrate to be located between the gate electrode and the gate insulation layer.

10. The semiconductor device according to claim 9, wherein:

the at least one gate structure comprises at least a first gate structure located in a first recess and a second gate structure located in a second recess, each gate structure having a first side facing a first direction and a second side opposite the first side; and wherein the semiconductor device further comprises a second impurity region disposed between the first and second gate structures, and the at least one impurity region includes a first impurity region located on the first side of the first gate structure and a third impurity region located on the second side of the second gate structure in the active region of the substrate.

11. The semiconductor device according to claim 10, wherein:

the first pad electrode extends from the first impurity region over the isolation region.

12. A semiconductor device, comprising:

a substrate having an active region and an isolation region;

at least one gate structure located in the active region of the substrate;

at least one impurity region in the substrate adjacent to the gate structure and the isolation region;

a first pad electrode located on the at least one impurity region and the isolation region; and a second pad electrode contacting a second impurity region, wherein the at least one gate structure comprises at least a first gate structure located in a first recess and a second gate structure located in a second recess, each gate structure having a first side facing a first direction and a second side opposite the first side, and the at least one impurity region includes a first impurity region located on the first side of the first gate structure, a second impurity region located between the first and second gate structures, and a third impurity region located on the second side of the second gate structure in the active region of the substrate, wherein the first pad electrode extends from the first impurity region over the isolation region, and the semiconductor device further comprises a first contact plug to contact a surface of the first pad electrode above the isolation region, and wherein the second pad electrode extends from the third impurity region over the isolation region, and the semiconductor device further comprises a second contact plug to contact a surface of the second pad electrode above the isolation region.

* * * * *